United States Patent
Lee et al.

(10) Patent No.: US 9,520,163 B2
(45) Date of Patent: Dec. 13, 2016

(54) REGULATOR CIRCUIT AND SEMICONDUCTOR MEMORY APPARATUS HAVING THE SAME

(71) Applicant: SK hynix Inc., Icheon-si Gyeonggi-do (KR)

(72) Inventors: Eun Jin Lee, Icheon-si (KR); Lee Hyun Kwon, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/740,400

(22) Filed: Jun. 16, 2015

(65) Prior Publication Data
US 2016/0275998 A1   Sep. 22, 2016

(30) Foreign Application Priority Data

Mar. 19, 2015  (KR) .................. 10-2015-0038195
May 8, 2015    (KR) .................. 10-2015-0064844

(51) Int. Cl.
*G11C 5/14*   (2006.01)
*G05F 1/575*  (2006.01)

(52) U.S. Cl.
CPC .............. *G11C 5/147* (2013.01); *G05F 1/575* (2013.01); *G11C 5/145* (2013.01)

(58) Field of Classification Search
CPC ........... G11C 5/147; G11C 5/145; G05F 1/575
See application file for complete search history.

(56) References Cited

U.S. PATENT DOCUMENTS

| 2004/0080303 | A1* | 4/2004  | Nishimaki | H02M 1/38 323/282 |
| 2006/0012354 | A1* | 1/2006  | Nunokawa  | G05F 1/575 323/273 |
| 2007/0046275 | A1* | 3/2007  | Shirai    | H02M 3/1588 323/284 |
| 2009/0296484 | A1* | 12/2009 | Wang      | G11C 5/147 365/185.18 |
| 2010/0244791 | A1* | 9/2010  | Nirschl   | H02M 3/07 323/282 |
| 2010/0321099 | A1* | 12/2010 | Hsieh     | H02M 3/07 327/536 |
| 2012/0139621 | A1* | 6/2012  | Kwon      | G11C 5/145 327/536 |

FOREIGN PATENT DOCUMENTS

KR    1020110043939 A    4/2011

* cited by examiner

*Primary Examiner* — Khamdan Alrobaie
(74) *Attorney, Agent, or Firm* — William Park & Associates Ltd.

(57) ABSTRACT

A regulator circuit may include a comparison unit configured to compare a reference voltage with a feedback voltage and generate a first switching signal. The regulator circuit may include a current supply unit configured to receive a pumping voltage, and determine a level of a second switching signal in response to the first switching signal. The regulator circuit may include an output driver configured to control the level of the second switching signal in response to an output voltage, receive the pumping voltage, and generate the output voltage in response to the second switching signal. The regulator circuit may include a feedback signal generation unit configured to detect a level of the output voltage and generate the feedback voltage.

19 Claims, 5 Drawing Sheets

//REGULATOR CIRCUIT AND SEMICONDUCTOR MEMORY APPARATUS HAVING THE SAME

CROSS-REFERENCES TO RELATED APPLICATION

The present application claims priority under 35 U.S.C. §119(a) to Korean application number 10-2015-0038195, filed on Mar. 19, 2015, and 10-2015-0064844, files on May 8, 2015 in the Korean Intellectual Property Office, which is incorporated herein by reference in its entirety.

BACKGROUND

1. Technical Field

Various embodiments generally relate to a semiconductor integrated circuit, and more particularly, to a regulator circuit and a semiconductor apparatus having the same.

2. Related Art

A semiconductor integrated circuit is a complex electronic device including a great number of electronic elements mounted on a substrate. The semiconductor integrated circuit also has a subminiature structure. The semiconductor integrated circuit requires power for operation. A voltage supply unit is a circuit for converting an external voltage into an internal voltage. The voltage supply unit supplies a preset level of voltage to the respective elements on the substrate.

In general, a low-level voltage is supplied to the semiconductor integrated circuit. In many cases, however, the semiconductor integrated circuit may require a high voltage for internal operation. Thus, the voltage supply unit may include a pump capable of generating a high voltage. The high voltage may be generated by pumping an external voltage inputted to the voltage supply unit at a low level. Furthermore, one of factors for determining the operating speed of the semiconductor integrated circuit is how fast the pump can raise a voltage to a target level.

For example, a flash memory apparatus requires a high voltage during a program or erase operation. The voltage supply unit must be able to generate a preset level of program voltage or erase voltage according to the operation mode of the flash memory apparatus. Furthermore, as the time required for generating and providing the preset level of program voltage or erase voltage decreases, the flash memory apparatus can reduce the entire time required for performing a program or erase operation.

The output voltage of the voltage supply unit must be constantly maintained at the target level. To constantly maintain the target level of the output voltage of the voltage supply unit a regulator circuit may be used.

The regulator circuit detects a pumped voltage, and determines whether to operate the pump according to a comparison result between the detected voltage and a reference voltage.

The semiconductor integrated circuit requires a different voltage level depending on the operation mode. Thus, according to the operation mode, the pump generates a preset level of high voltage. The generated high voltage must be able to maintain the corresponding level in the regulator circuit. Furthermore, when the required voltage level is changed, the output voltage of the pump may be changed. In this case, the regulator circuit is required to maintain the high voltage at the changed level.

Such a high-voltage supply operation may serve as a factor in determining the operation reliability as well as the operating speed of the semiconductor integrated circuit.

SUMMARY

According to an embodiment, there may be provided a regulator circuit. The regulator circuit may include a comparison unit configured to compare a reference voltage with a feedback voltage and generate a first switching signal. The regulator circuit may include a current supply unit configured to receive a pumping voltage, and determine a level of a second switching signal in response to the first switching signal. The regulator circuit may include an output driver configured to control the level of the second switching signal in response to an output voltage, receive the pumping voltage, and generate the output voltage in response to the second switching signal. The regulator circuit may include a feedback signal generation unit configured to detect a level of the output voltage and generate the feedback voltage.

According to an embodiment, there may be provided a regulator circuit. The regulator circuit may include an output driver, the output driver may include an output unit configured to receive a pumping voltage and generate an output voltage according to a switching signal. The output driver may include a control unit configured to control a level of the switching signal based on a level of the output voltage.

According to an embodiment, there may be provided a semiconductor apparatus. The semiconductor apparatus may include a controller, and a memory circuit controlled by the controller. The semiconductor apparatus may include a voltage supply unit configured to provide an output voltage to the memory circuit according to control of the controller. The voltage supply unit may include a regulator circuit, the regulator circuit may include a comparison unit configured to compare a reference voltage with a feedback voltage and generate a first switching signal. The regulator circuit may include a current supply unit configured to receive a pumping voltage, and determine a level of a second switching signal in response to the first switching signal. The regulator circuit may include an output driver configured to control the level of the second switching signal in response to the output voltage, receive the pumping voltage, and generate the output voltage in response to the second switching signal. The regulator circuit may include a feedback signal generation unit configured to detect a level of the output voltage and generate the feedback voltage.

DETAILED DESCRIPTION

Hereinafter, a regulator circuit and a semiconductor apparatus having the same according to the present disclosure will be described below with reference to the accompanying drawings through various examples of embodiments.

Figure 1:
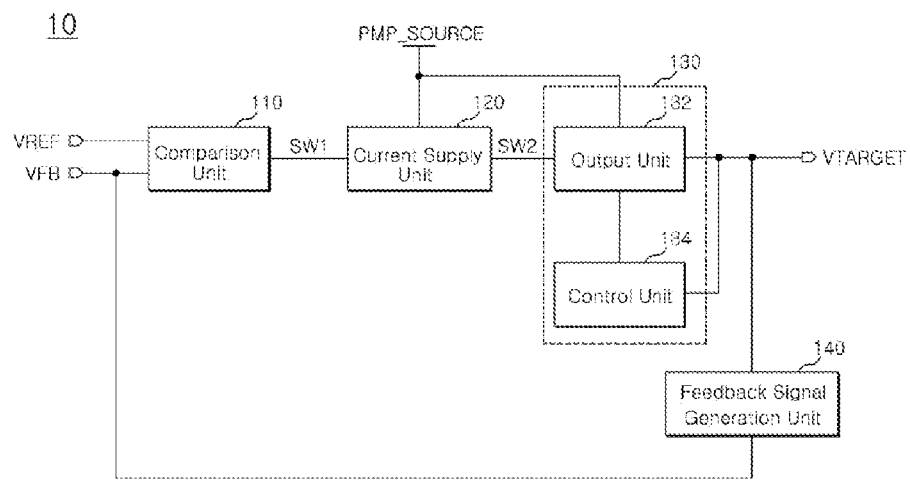
FIG. 1 is a configuration diagram illustrating a representation of an example of a regulator circuit according to an embodiment.

FIG. 1 is a configuration diagram illustrating a representation of an example of a regulator circuit according to an embodiment.

Referring to FIG. 1, the regulator circuit 10 may include a comparison unit 110, a current supply unit 120, an output driver 130, and a feedback signal generation unit 140.

The comparison unit 110 may compare a reference voltage VREF and a feedback voltage VFB. In an embodiment, the comparison unit 110 may be configured to generate a first switching signal SW1. The first switching signal SW1 may be enabled when, for example, the level of the feedback voltage VFB is higher than the level of the reference voltage VREF. The first switching signal SW1 may be disabled when, for example, the level of the feedback voltage VFB is lower than the level of the reference voltage VREF.

The current supply unit 120 may be configured to receive a pumping voltage PMP_SOURCE. The current supply unit 120 may be configured to determine the voltage level of a second switching signal SW2 in response to the first switching signal SW1. In an embodiment, when the first switching signal SW1 is enabled, the current supply unit 120 may lower the voltage level of the second switching signal SW2 by discharging the pumping voltage PMP_SOURCE. When, for example, the first switching signal SW1 is disabled, the current supply unit 120 may raise the voltage level of the second switching signal SW2 by the amount of current based on the pumping voltage PMP_SOURCE.

The output driver 130 may be configured to receive the pumping voltage PMP_SOURCE and generate an output voltage VTARGET. The output driver 130 may be configured to receive the pumping voltage PMP_SOURCE and generate the output voltage VTARGET in response to the second switching signal SW2 and the output voltage VTARGET.

The output driver 130 may include an output unit 132 and a control unit 134, for example. The output unit 132 may receive the pumping voltage PMP_SOURCE and generate the output voltage VTARGET. The output unit 132 may receive the pumping voltage PMP_SOURCE and generate the output voltage VTARGET in response to the second switching signal SW2. The control unit 134 may control the potential level of the output unit 132 in synchronization with the output voltage VTARGET. In an embodiment, the control unit 134 may control the potential level of the output unit 132 by controlling the potential level of the second switching signal SW2 according to the level of the output voltage VTARGET.

The feedback signal generation unit 140 may detect the level of the output voltage VTARGET and generate the feedback voltage VFB. The feedback voltage VFB may be provided to the comparison unit 110.

In an embodiment, the output driver 130 may determine the level of the output voltage VTARGET based on the level of the output voltage VTARGET as well as the level of the second switching signal SW2 generated through the current supply unit 120.

In the following descriptions, for example, suppose that the operation mode of the semiconductor apparatus to which the regulator circuit 10 is applied is changed from a first operation mode in which the semiconductor apparatus operates at a first high voltage having a first level to a second operation mode in which the semiconductor apparatus operates at a second high voltage having a lower level than the first level. In the first operation mode, the regulator circuit 10 may maintain the output voltage VTARGET at the first high voltage. However, when the operation mode is changed to the second operation mode, the regulator circuit 10 needs to change the output voltage VTARGET to the second high voltage lower than the first high voltage, and maintain the second high voltage. When the output voltage VTARGET is changed from the first high voltage to the second high voltage, the output driver 130 can determine the level of the output voltage VTARGET in synchronization with the changed output voltage VTARGET, thereby minimizing a response time required for generating the output voltage VTARGET at the target level.

In an embodiment, when the output driver 130 determines the level of the output voltage VTARGET in synchronization with the changed output voltage VTARGET, it may indicate that the control unit 134 generates a control signal based on the output voltage VTARGET, and the output unit 132 generates the output voltage VTARGET at the target level based on the control signal. However, the embodiments are not limited thereto.

Figure 2:
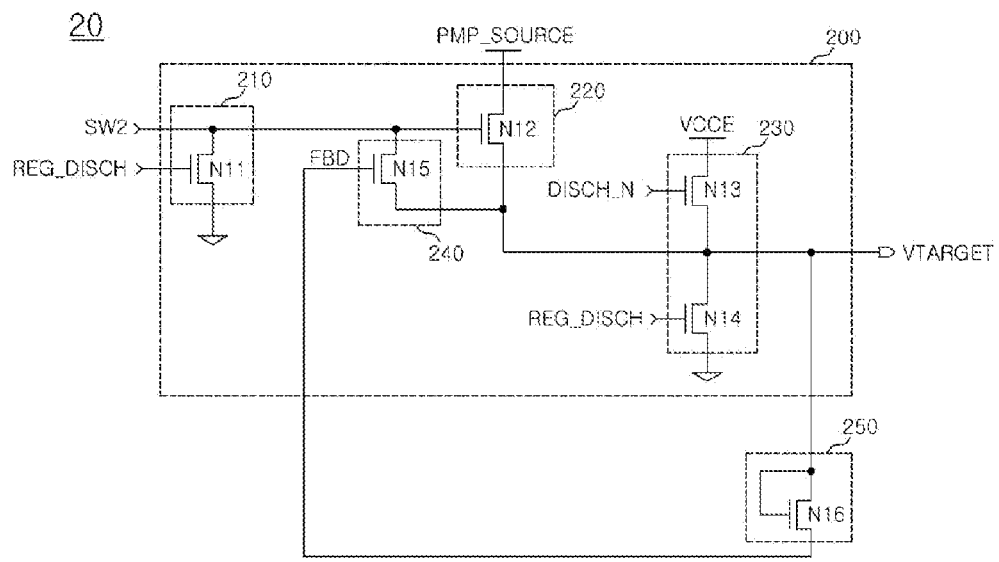
FIG. 2 is a configuration diagram illustrating a representation of an example of an output driver according to an embodiment.

FIG. 2 is a configuration diagram illustrating a representation of an example of the output driver according to an embodiment.

Referring to FIG. 2, the output driver 20 according to an embodiment may include an output unit 200 and a control unit 250.

The output unit 200 may include a first discharge unit 210, a source current supply unit 220, a second discharge unit 230, and a feedback discharge unit 240.

The first discharge unit 210 may be configured to discharge a second switching signal supply terminal SW2. The first discharge unit 210 may discharge the second switching signal supply terminal SW2 in response to a discharge signal REG_DISCH. In an embodiment, the first discharge unit 210 may include a switching element N11. The switching element N11 may be coupled between the second switching signal supply terminal SW2 and a ground terminal. The switching element N11 may be driven in response to the discharge signal REG_DISCH, but is not limited thereto. During a discharge operation, the discharge signal REG_DISCH may be enabled to lower the potential level of the second switching signal supply terminal SW2.

The source current supply unit 220 may be configured to receive the pumping voltage PMP_SOURCE. The source current supply unit 220 may be configured to generate the output voltage VTARGET in response to the second switching signal SW2. In an embodiment, the source current supply unit 220 may include a switching element N12. The switching element N12 may be coupled between a pumping voltage supply terminal PMP_SOURCE and an output voltage VTARGET application terminal. The switching element N12 may be driven in response to the second switching signal SW2, but is not limited thereto.

The second discharge unit 230 may be configured to discharge the output voltage VTARGET application terminal. The second discharge unit 230 may discharge the output voltage VTARGET application terminal in response to a discharge enable signal DISCH_N and the discharge signal REG_DISCH. In an embodiment, the second discharge unit 230 may include a switching element N13 coupled to a power supply terminal VCCE and a switching element N14. The switching element N13 may be driven in response to the discharge enable signal DISCH_N, but is not limited thereto. The switching element N14 may be coupled between the switching element N13 and the ground terminal. The switching element N14 may be driven in response to the discharge signal REG_DISCH, but is not limited thereto. During a discharge operation, for example, the discharge enable signal DISCH_N may be disabled, and the discharge signal REG_DISCH may be enabled. Thus, the potential level of the output voltage VTARGET application terminal may be lowered.

The feedback discharge unit 240 may be configured to control the level of the second switching signal SW2 based on a control voltage FBD. The control voltage FBD may be generated according to the level of the output voltage VTARGET. In an embodiment, when the output voltage VTARGET is generated at an abnormally high level, the feedback discharge unit 240 may discharge the second switching signal supply terminal SW2 through the second discharge unit 230. For example, the feedback discharge unit 240 may include a switching element N15. The switching element N15 may be coupled between the second switching signal supply terminal SW2 and the ground terminal. The switching element N15 may be driven in response to the control voltage FBD, but is not limited is thereto.

The control unit 250 may be configured to generate the control voltage FBD based on the level of the output voltage VTARGET. In an embodiment, the control unit 250 may include a switching element N16. The switching element N16 may be diode-coupled to the output voltage VTARGET application terminal. The switching element N16 may generate the control voltage FBD, but is not limited thereto.

The control unit 250 illustrated in FIG. 2 may generate the control voltage FBD by subtracting a threshold voltage VTH1 of the switching element N16 from the level of the output voltage VTARGET. For example, the control voltage FBD may have a level of VTARGET−VTH1.

When the output voltage VTARGET of the regulator circuit 10 is constantly maintained at the target level, the threshold voltage VTH1 of the switching element N16 may be determined as a level at which the switching element N15 forming the feedback discharge unit 240 can be turned off. In an embodiment, the target level may be preset.

When the output voltage VTARGET is maintained at the target level, the switching element N15 may be turned off because a potential difference between the output level of the source current supply unit 220 and the level of the control voltage FBD is lower than a threshold voltage VTH2 of the switching element N15. Furthermore, the source current supply unit 220 may generate the output voltage VTARGET as an output voltage which is constantly maintained.

On the other hand, when the output voltage VTARGET abnormally rises, that is, when bouncing occurs, the discharge signal REG_DISCH may be enabled to perform a discharge operation. Furthermore, the control voltage FBD generated through the control unit 250 may rise to turn on the switching element N15 forming the feedback discharge unit 240. Thus, the second switching signal supply terminal SW2 may be rapidly discharged through the second discharge unit 230, and the level of the output voltage VTARGET generated through the source current supply unit 220 may rapidly drop.

That is, in an embodiment, the regulator circuit can control the level of the second switching signal SW2 which is a driving voltage of the source current supply unit 220, in synchronization with the level of the output voltage VTARGET. Thus, when bouncing occurs, the regulator circuit can control the level of the output voltage VTARGET at a high speed.

Figure 3:
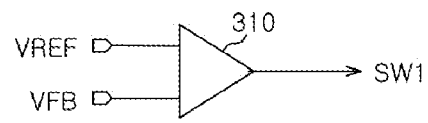
FIG. 3 is a configuration diagram illustrating a representation of an example of a comparison unit according to an embodiment.

FIG. 3 is a configuration diagram illustrating a representation of an example of the comparison unit according to an embodiment.

The comparison unit 30 according to an embodiment may include a comparison circuit 310. The comparison circuit 310 may compare the reference voltage VREF and the feedback voltage VFB. The comparison circuit 310 may output the first switching signal SW1. In an embodiment, the comparison circuit 310 may be configured to generate the first switching signal SW1 enabled when, for example, the level of the feedback voltage VFB is higher than the level of the reference voltage VREF. In an embodiment, the comparison circuit 310 may be configured to generate the first switching signal SW1 disabled when, for example, the level of the feedback voltage VFB is lower than the level of the reference voltage VREF.

Figure 4:
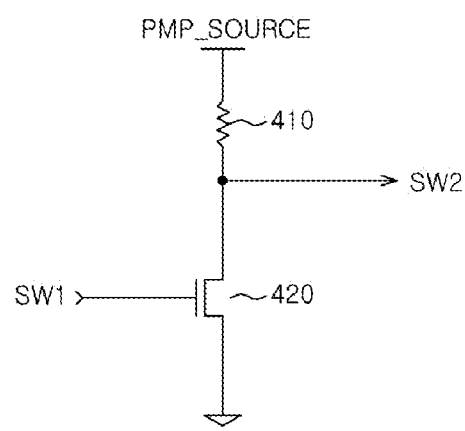
FIG. 4 is a configuration diagram illustrating a representation of an example of a current supply unit according to an embodiment.

FIG. 4 is a configuration diagram illustrating a representation of an example of the current supply unit according to an embodiment.

The current supply unit 40 according to an embodiment may be configured to receive the pumping voltage PMP_SOURCE. The current supply unit 40 may be configured to determine the voltage level of the second switching signal SW2. The current supply unit 40 may be configured to determine the voltage level of the second switching signal SW2 in response to the first switching signal SW1. In an embodiment, the current supply unit 40 may include a resistance element 410. The resistance element may be coupled between the pumping voltage PMP_SOURCE supply terminal and the second switching signal SW2 supply terminal. The current supply unit 40 may include a switching element 420 coupled between the resistance element 410 and the ground terminal. The switching element 420 may be driven in response to the first switching signal SW1, but is not limited thereto.

For example, when the first switching signal SW1 is enabled, the switching element 420 may be turned on. Then, the pumping voltage PMP_SOURCE may be discharged to lower the voltage level of the second switching signal SW2. In an embodiment, when, for example, the first switching signal SW1 is disabled, the switching element 420 may be turned off to raise the voltage level of the second switching signal SW2 by the amount of current based on the pumping voltage PMP_SOURCE.

Figure 5:
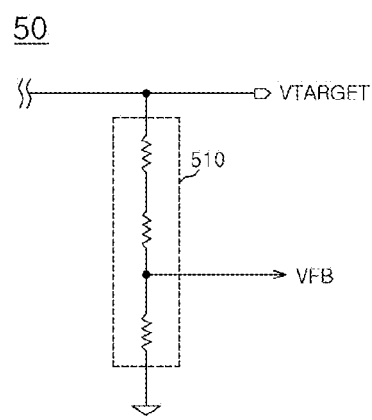
FIG. 5 is a configuration diagram illustrating a representation of an example of a feedback signal generation unit according to an embodiment.

FIG. 5 is a configuration diagram illustrating a representation of an example of the feedback signal generation unit according to an embodiment.

The feedback signal generation unit 50 according to an embodiment may detect the level of the output voltage VTARGET and generate the feedback voltage VFB. For this operation, the feedback signal generation unit 50 may include, for example but not limited to, a resistor chain 510 coupled in series between the output voltage VTARGET application terminal and the ground terminal. The feedback voltage VFB may be provided to the above-described comparison unit 110.

The configurations of the comparison unit 30, the current supply unit 40, and the feedback signal generation unit 50, illustrated in FIGS. 3 to 5, respectively, are only examples. The comparison unit 30, the current supply unit 40, and the feedback signal generation unit 50 can be designed to include other components capable of performing the respective functions.

Regardless of how the respective units are configured, the regulator circuit 10 according to an embodiment may control the level of the output voltage VTARGET depending on the level of the output voltage VTARGET, when the output driver 130 or 20 is configured. Thus, when a discharge operation is performed due to an abnormal rise in level of the output voltage VTARGET, the output voltage VTARGET may rapidly return to a normal level.

Figure 6:
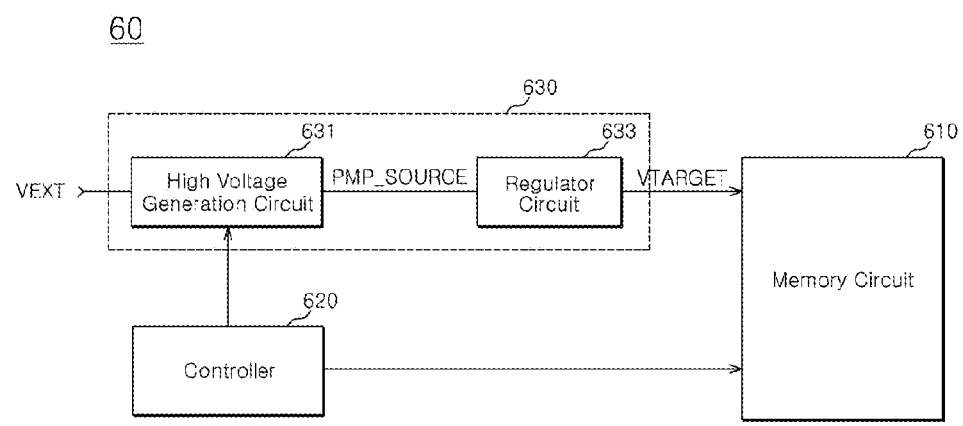
FIG. 6 is a configuration diagram illustrating a representation of an example of a semiconductor apparatus according to an embodiment.

FIG. 6 is a configuration diagram illustrating a representation of an example of a semiconductor apparatus according to an embodiment.

The semiconductor apparatus 60 according to an embodiment may include a memory circuit 610, a controller 620, and a voltage supply unit 630.

The memory circuit 610 may include a column control unit and a row control unit. The memory circuit 610 may include a plurality of memory cells coupled between a plurality of word lines and a plurality of bit lines.

The controller 620 may control the operation of the memory circuit 610, for example, a program, erase, or read operation.

The voltage supply unit 630 may pump an external voltage VEXT and provide an output voltage VTARGET maintained at a predetermined level to the memory circuit 610.

The voltage supply unit 630 may include a high voltage generation circuit 631 and a regulator circuit 633. The high voltage generation circuit 631 may generate a pumping voltage PMP_SOURCE by pumping the external voltage VEXT. The regulator circuit 633 may generate the output voltage VTARGET at the predetermined level, using the pumping voltage PMP_SOURCE.

The regulator circuit 633 may include the regulator circuit described with reference to FIGS. 1 to 5.

Figure 7:
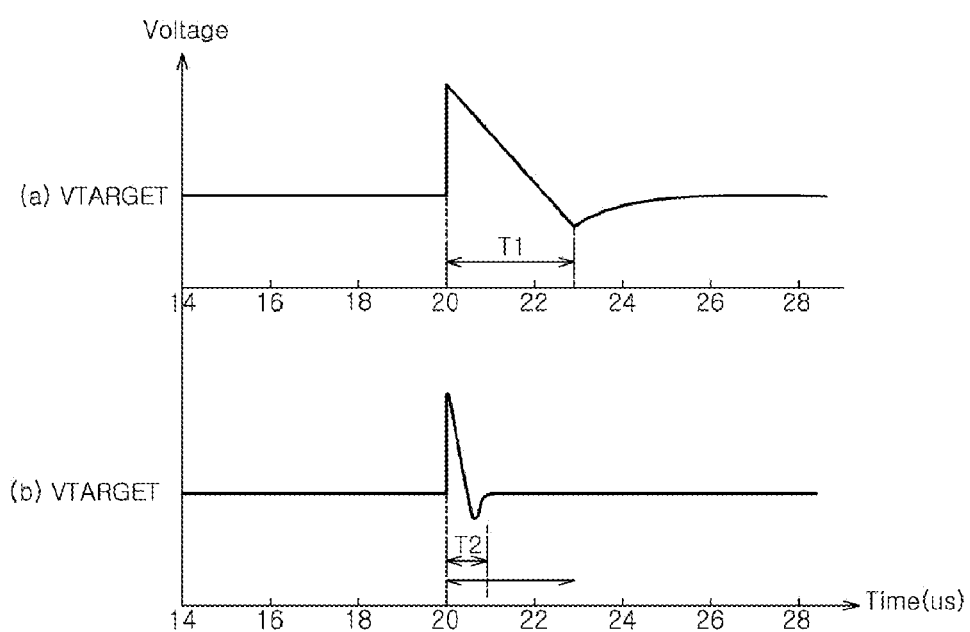
FIG. 7 is a graph illustration of an example for describing the operation of a regulator circuit according to an embodiment.

FIG. 7 is a graph illustration of an example for describing the operation of a regulator circuit according to an embodiment.

The output voltage VTARGET generated through the regulator circuit 10 may maintain a constant level. However, when bouncing occurs, the output voltage VTARGET may abnormally rise. In this example, the regulator circuit 10 may perform a discharge operation by enabling the discharge signal REG_DISCH as indicated by a graph A. However, a time T1 of several microseconds µs may be required until the output voltage returns to the normal level VTARGET. Furthermore, since the semiconductor apparatus can be normally operated after the time T1, the operating speed can be reduced.

On the other hand, in an embodiment, the level of the output voltage VTARGET may be controlled according to the level of the output voltage VTARGET. For example, as illustrated in FIG. 2, the second switching signal supply terminal SW2 may be discharged through the control voltage FBD which is generated according to the level of the output voltage VTARGET. Thus, the source current supply unit 220 may rapidly react.

Thus, immediately after bouncing at T2, the output voltage application terminal VTARGET may return to the normal level VTARGET, and the semiconductor apparatus may perform a normal operation at high speed.

Figure 8:
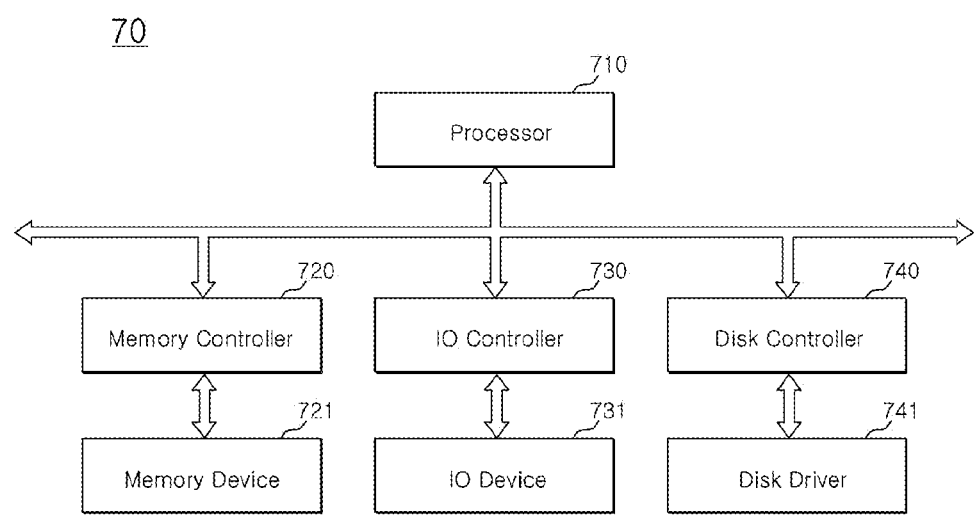
FIG. 8 is a configuration diagram illustrating a representation of an example of an electronic system according to an embodiment.

FIG. 8 is a configuration diagram illustrating a representation of an example of an electronic system according to an embodiment.

The electronic system 70 according to an embodiment may include a processor 710, a memory controller 720, and a memory device 721. The electronic system 70 may include an IO controller 730, an IO device 731, a disk controller 740, and a disk driver 741.

The electronic system 70 may include one or more processors 710 which can be operated independently or in connection with another processor. The processor 710 can communicate with other elements, for example, the memory controller 720, the IO controller 730, and the disk controller 740, through buses (a control bus, an address bus, and a data bus).

The memory controller 720 may be coupled to one or more memory devices 721. The memory controller 720 may receive a request provided from the processor 710, and control one or more memory devices 721 based on the request.

The memory device 721 may include the semiconductor apparatus illustrated in FIG. 6.

The IO controller 730 may be coupled between the processor 710 and the IO device 731, and transmit an input from the IO device 731 to the processor 710 or provide a processing result of the processor 710 to the IO device 731. The IO device 731 may include an input device such as keyboard, mouse, touch screen, or mike and an output device such as display or speaker.

The disk controller 740 may control one or more disk drivers 741 according to control of the processor 710.

In such an electronic system 70, when the memory device 721 is operated under control of the processor 710, a voltage supply unit provided in the memory device 721 may include the regulator circuit described with reference to FIGS. 1 to 5, for example. Thus, the potential level of an output voltage VTARGET application terminal can be controlled in synchronization with the level of an output voltage VTARGET. Thus, when bouncing occurs so that the level of the output voltage VTARGET abnormally rises, the regulator circuit can rapidly return the level of the output voltage VTARGET to a normal level.

While certain embodiments have been described above, it will be understood to those skilled in the art that the embodiments described are by way of example only. Accordingly, the regulator circuit described herein should not be limited based on the described embodiments. Rather, the regulator circuit described herein should only be limited in light of the claims that follow when taken in conjunction with the above description and accompanying drawings.

What is claimed is:
1. A regulator circuit comprising:
a comparison unit configured to compare a reference voltage with a feedback voltage and generate a first switching signal;
a current supply unit configured to receive a pumping voltage, and determine a level of a second switching signal in response to the first switching signal;
an output driver configured to control the level of the second switching signal in response to an output voltage, receive the pumping voltage, and generate the output voltage in response to the second switching signal; and
a feedback signal generation unit configured to detect a level of the output voltage and generate the feedback voltage.

2. The regulator circuit according to claim 1, wherein the output driver comprises:
an output unit configured to receive the pumping voltage and generate the output voltage in response to the second switching signal; and
a control unit configured to control the level of the second switching signal based on the level of the output voltage.

3. The regulator circuit according to claim 1, wherein the output driver comprises:
an output unit configured to receive the pumping voltage and generate the output voltage in response to the second switching signal; and
a control unit configured to control a potential level of the output unit in synchronization with the output voltage.

4. The regulator circuit according to claim 1, wherein the output driver comprises:
an output unit configured to receive the pumping voltage and generate the output voltage in response to the second switching signal; and
a control unit configured to control a potential level of the output unit by controlling a potential level of the second switching signal according to the level of the output voltage.

5. The regulator circuit according to claim 1, wherein the output driver comprises:
a first discharge unit configured to control a potential level of the second switching signal supply terminal in response to a discharge signal;
a source current supply unit configured to receive the pumping voltage and generate the output voltage in response to the second switching signal;
a second discharge unit configured to control a potential level of an output voltage application terminal in response to the discharge signal; and
a feedback discharge unit configured to control the potential level of the second switching signal in response to a control voltage generated on the basis of the level of the output voltage.

6. The regulator circuit according to claim 5, further comprising:
a control unit including a switching element configured to generate the control voltage,
wherein the control unit is diode-coupled to the output voltage application terminal.

7. The regulator circuit according to claim 6, wherein when the output voltage maintains a preset target level, the threshold voltage of the switching element is determined to disable the feedback discharge unit.

8. The regulator circuit according to claim 6, wherein the control unit is configured to generate the control voltage by subtracting a threshold voltage of the switching element from the level of the output voltage.

9. The regulator circuit according to claim 1, wherein the current supply unit lowers the level of the second switching signal by discharging the pumping voltage when the first switching signal is enabled, and raises the level of the second switching signal based on the pumping voltage when the first switching signal is disabled.

10. The regulator circuit according to claim 9,
wherein the first switching signal is enabled when a level of the feedback voltage is greater than a level of the reference voltage, and
wherein the first switching signal is disabled when the level of the feedback voltage is lower than the level of the reference voltage.

11. A regulator circuit including an output driver, the output driver comprising:
an output unit configured to receive a pumping voltage and generate an output voltage according to a switching signal; and
a control unit configured to control a level of the switching signal based on a level of the output voltage,
wherein the output unit comprises a feedback discharge unit, the feedback discharge unit is driven in response to a control voltage and configured to control the level of the switching signal.

12. The regulator circuit according to claim 11, wherein the control unit comprises a switching element, the switching element diode-coupled to an output voltage application terminal and the switching element configured to generate the control voltage.

13. The regulator circuit according to claim 12, wherein when the output voltage maintains a preset target level, the threshold voltage of the switching element is determined to disable the feedback discharge unit.

14. The regulator circuit according to claim 13, wherein the control unit is configured to generate the control voltage by subtracting a threshold voltage of the switching element from the level of the output voltage.

15. A semiconductor apparatus comprising:
a memory circuit;
a controller configured to control the memory circuit; and
a voltage supply unit configured to provide an output voltage to the memory circuit according to control of the controller,
wherein the voltage supply unit includes a regulator circuit, the regulator circuit comprises:
a comparison unit configured to compare a reference voltage with a feedback voltage and generate a first switching signal;
a current supply unit configured to receive a pumping voltage, and determine a level of a second switching signal in response to the first switching signal;
an output driver configured to control the level of the second switching signal in response to the output voltage, receive the pumping voltage, and generate the output voltage in response to the second switching signal; and
a feedback signal generation unit configured to detect a level of the output voltage and generate the feedback voltage.

16. The semiconductor apparatus according to claim 15, wherein the output driver comprises:
an output unit configured to receive the pumping voltage and generate the output voltage in response to the second switching signal; and
a control unit configured to control the level of the second switching signal based on the level of the output voltage.

17. The semiconductor apparatus according to claim 15, wherein the output driver comprises:
a first discharge unit configured to control a potential level of the second switching signal supply terminal in response to a discharge signal;
a source current supply unit configured to receive the pumping voltage and generate the output voltage in response to the second switching signal;
a second discharge unit configured to control a potential level of an output voltage application terminal in response to the discharge signal; and a feedback discharge unit configured to control the potential level of the second switching signal in response to a control voltage generated on the basis of the level of the output voltage.

18. The semiconductor apparatus according to claim 17, further comprising:
a control unit including a switching element configured to generate the control voltage,
wherein the control unit is diode-coupled to the output voltage application terminal.

19. The semiconductor apparatus according to claim 18, wherein when the output voltage maintains a preset target level, the threshold voltage of the switching element is determined to disable the feedback discharge unit.

* * * * *